United States Patent
Knopeck et al.

(10) Patent No.: US 7,270,717 B2
(45) Date of Patent: Sep. 18, 2007

(54) COMPOSITIONS AND METHODS FOR CLEANING CONTAMINATED ARTICLES

(75) Inventors: Gary Knopeck, Lakeview, NY (US); Rajiv R. Singh, Getzville, NY (US); Kane Cook, Eggertsville, NY (US); Ian Shankland, Randolph, NJ (US); Harold Kieta, Buffalo, NY (US)

(73) Assignee: Honeywell International Inc., Morristown, NJ (US)

( * ) Notice: Subject to any disclaimer, the term of this patent is extended or adjusted under 35 U.S.C. 154(b) by 461 days.

(21) Appl. No.: 10/737,049

(22) Filed: Dec. 16, 2003

(65) Prior Publication Data

US 2004/0167053 A1 Aug. 26, 2004

Related U.S. Application Data

(60) Provisional application No. 60/434,011, filed on Dec. 17, 2002.

(51) Int. Cl.
*B08B 3/00* (2006.01)
(52) U.S. Cl. ............................. 134/34; 134/30; 134/31; 134/40; 134/42; 510/204; 510/213; 510/365; 510/405; 510/407; 510/412; 252/67; 252/69
(58) Field of Classification Search .................. 134/30, 134/31, 40, 42, 34; 510/204, 213, 365, 405, 510/407, 412, 265
See application file for complete search history.

(56) References Cited

U.S. PATENT DOCUMENTS

| | | | | |
|---|---|---|---|---|
| 4,150,493 A | * | 4/1979 | Slinn et al. | 34/350 |
| 5,055,138 A | | 10/1991 | Slinn | |
| 5,174,855 A | * | 12/1992 | Tanaka | 216/99 |
| 5,288,333 A | * | 2/1994 | Tanaka et al. | 134/31 |
| 5,514,221 A | | 5/1996 | Bolmer et al. | |
| 5,552,080 A | | 9/1996 | Bolmer et al. | |
| 5,902,412 A | | 5/1999 | Taylor | |
| 6,133,221 A | | 10/2000 | Beaver et al. | 510/412 |
| 6,291,416 B1 | | 9/2001 | Michaud et al. | 510/411 |

* cited by examiner

*Primary Examiner*—Sharidan Carrillo

(57) ABSTRACT

Disclosed are compositions and methods for cleaning contaminated articles based on the provision of a zeotropic composition comprising (a) at least one flammable solvent having a boiling point at a first pressure; (b) at least one first nonflammable solvent having a boiling point at said first pressure which is less than about said first pressure boiling point of said flammable solvent; and (c) at least one second nonflammable solvent having a boiling point at said first pressure which is greater than about the first pressure boiling point of said flammable solvent.

36 Claims, 1 Drawing Sheet

COMPOSITIONS AND METHODS FOR CLEANING CONTAMINATED ARTICLES

CROSS-REFERENCE TO RELATED APPLICATIONS

This application claims the benefit of U.S. Provisional Application No. 60/434,011, filed Dec. 17, 2002.

FIELD OF THE INVENTION

The present invention relates to compositions, methods and systems for removing contaminants from articles.

BACKGROUND OF THE INVENTION

Cleaning of products and parts of products to remove contaminants such as waxes, greases, oils and solder flux residues is an integral part of many manufacturing, maintenance, and refurbishing operations. Furthermore, many metallic articles or components parts are treated with oil or other processing agent during the fabrication process, and it is frequently required that this oil must be removed before the article is ready for use or sale or the component is installed in the finished product. Also, excess rosin flux must often be removed from printed circuit boards before the boards are acceptable for use. Solvent cleaning processes are often used to remove contaminants from such articles and parts.

A widely known commercial solvent cleaning process is semi-aqueous cleaning. Semi-aqueous cleaning involves the cleaning of an article in a relatively high boiling point solvent, such as terpenes, esters, or petroleum distillates that have a high affinity for oils, waxes, and greases. Such solvents may be used with or without the aid of a surfactant. Once cleaned of contaminants, the article is commonly rinsed of the high boiling hydrocarbon solvent with multiple rinsing steps using purified water. The hydrocarbon solvent is then typically phase separated from the water and returned back to the wash sump while the aqueous effluent must be processed before sewering to ground water. A drawback of this process is that the hydrocarbon solvent usually possesses a low flash point and, therefore, the solvent must be carefully handled or blanketed with a nonflammable compressed gas such as nitrogen to minimize the risk of explosion. Nitrogen gas is much more fugitive than the dense vapors of a fluorocarbon contained in a condensing zone. Furthermore, in a number of applications, while the article to be cleaned may be compatible with the hydrocarbon solvent, some plastics or metals may be incompatible with the aqueous rinse solvent, resulting in water absorption or rusting of the article.

Chlorofluorocarbons (CFCs), such as 1,1,2-trichloro-1,2,2-trifluoroethane (CFC-113) have been widely used in industry for cleaning and degreasing highly-varied solid surfaces, for example metal components, glasses, plastics, composites and the like. It is common, however, that solvent compositions include cosolvents to improve one or more properties important to the cleaning function relative to the use of any one of the solvents alone. For example, U.S. Pat. No. 6,133,221 discloses cleaning processes that may involve the use certain hydrobrominated compounds together with one or more cosolvents that have a solvent utility in combination with such compounds.

In many prior cleaning applications, there is a concern relating to potential fire or explosion hazards associated with exposing the solvents used in the cleaning composition to a heat source. One approach to limit the potential hazards associated with exposing solvents to a heat source is to utilize only pure nonflammable solvents.

Although the types of solvents that have heretofore been used for the removal of residual contaminants from materials are numerous and varied, many of the preferred solvents are highly flammable. Utilizing only a single solvent may also limit the effectiveness of the cleaning process. For example, chlorinated hydrocarbons, aliphatic hydrocarbons, alcohols, and terpenes are known rosin flux solvents. Because of their low vapor pressures and good solvating ability in the vapor state, chlorinated hydrocarbons, including chlorofluorocarbons, have been widely used in vapor degreasing type processes. However, chlorinated hydrocarbons are generally relatively poor solvents for any ionic residues which may be present on the substrate to be cleaned. For this and other reasons, chlorinated hydrocarbons in general, and chlorofluorocarbons in particular, have sometimes been used in combination with other low-boiling solvents.

An alternative approach to using single component solvents is to use a combination of cosolvents which have no flash or fire point, as disclosed for example in U.S. Pat. No. 6,133,221. This patent discloses that, particularly for degreasing applications, such cosolvents are preferably chosen to provide a cleaning solvent composition which forms either a constant boiling azeotrope or at least a solvent composition which will distill without any substantial change in composition for at least about 24 hours so that it can be recycled without any significant dilution or concentration of any of the components. The use of azeotrope-like compositions which do not exhibit a flash point for drying and cleaning applications is also disclosed in U.S. Pat. No. 6,291,416. The use of non-azeotropic mixtures of components containing flammable solvents has thus heretofore generally been recognized as being dangerous for use in vapor degreasing because flammable compositions may tend to develop in one or more portions of the vapor degreasing apparatus as the cleaning process proceeds.

However, the discovery of non-segregating (azeotropic) nonflammable mixtures of flammable and nonflammable solvents that form azeotropic compositions is difficult and unpredictable. Applicants have therefore recognized the need for methods of cleaning which safely use non-azeotropic solvent compositions to effectively clean articles. Specifically, applicants have recognized the need for non-azeotropic combinations of nonflammable and flammable solvents that segregate during cleaning operations, yet remain nonflammable throughout the cleaning operation.

DESCRIPTION OF THE INVENTION AND PREFERRED EMBODIMENTS

Figure 1:
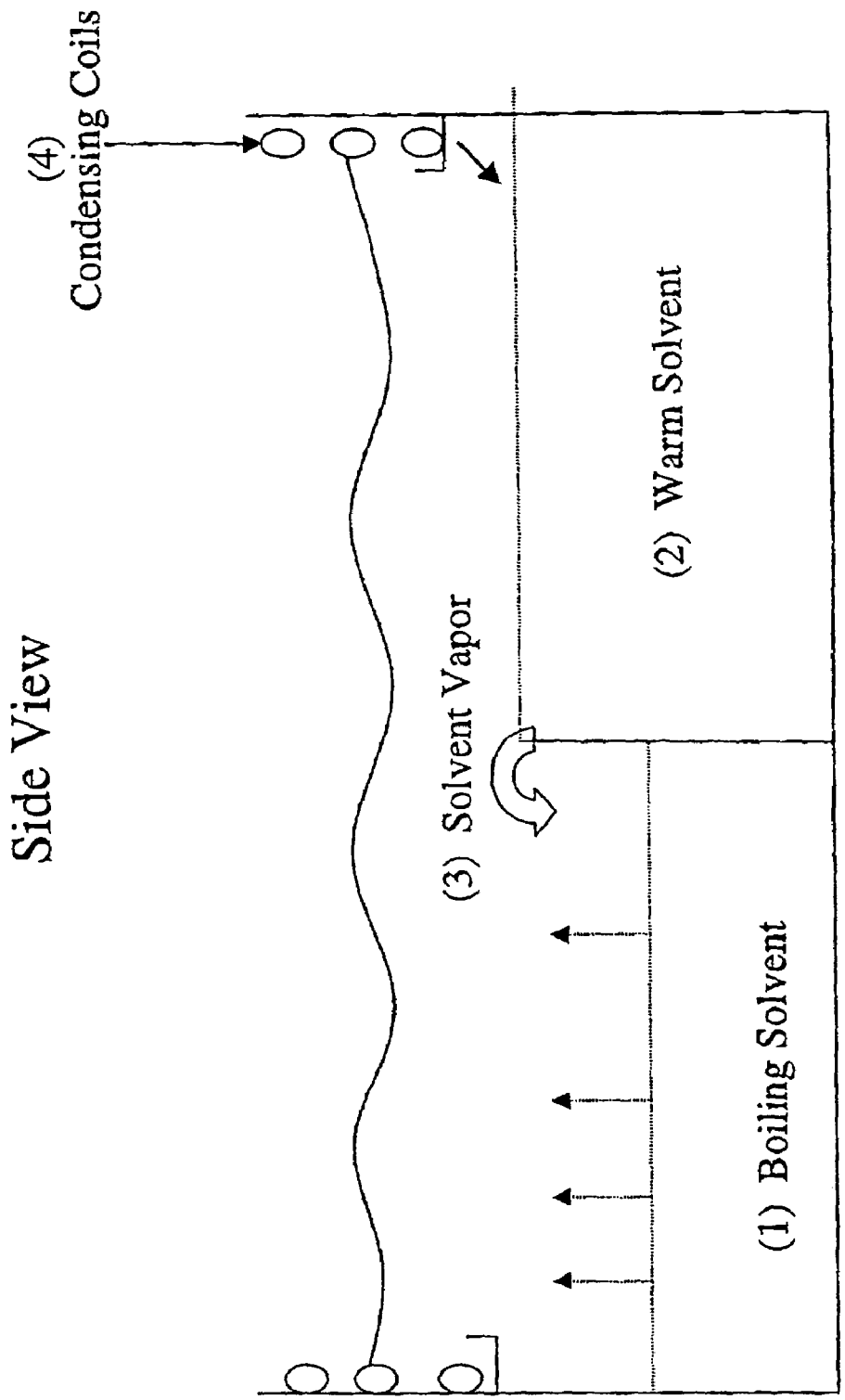
FIG. 1 is a side-view diagram of a two-sump vapor degreaser for use in certain embodiments of the present methods.

The preferred aspects of the present invention meet the aforementioned needs, and others, by providing effective solvating agents and methods for cleaning an article containing contaminants using a solvent composition containing both flammable and nonflammable solvents. Applicants have discovered that certain combinations of solvents comprising at least one flammable solvent and plurality of nonflammable solvents segregate in certain cleaning processes, including certain vapor degreasing processes, but, advantageously, do not segregate in such a way so as to produce flammable solvent mixtures during such cleaning processes. In certain preferred embodiments, applicants have discovered that desirable and effective cleaning compositions can be provided by combining a flammable solvent with at least one nonflammable solvent having a boiling point at a first pressure, which is preferably the expected operating pressure of the cleaning system in which it is intended for use, which is higher than the first pressure boiling point of the flammable solvent and at least one nonflammable solvent having a boiling point at the first pressure which is lower than the first pressure boiling point of the flammable solvent. In many preferred embodiments, the expected operating pressure of the system is substantially one atmosphere, and therefore in many preferred embodiments the boiling points being compared are the normal boiling points of the solvents. Unless otherwise indicated herein, the term "boiling point" refers to normal boiling point.

The preferred cleaning methods of the present invention involve the use of a solvating agent of the present invention to effectively remove adherent contaminants from the surface of articles by means of a solvation process. Additionally or alternatively, cleaning is achieved by contacting the article with the solvating agent whereby the contaminants are removed by the kinetic force of the solvating agent. The term "article" is used herein to designate and include within its meaning any device, article of manufacture, or any portion or surface of any such device or article, which may be subject to contamination by unwanted materials. Thus, the term "article" encompasses, for example, machine parts, tools, component assemblies, printed circuit boards, and any portion or surface of any of these. The term "contaminant" is likewise used in a broad sense to designate unwanted materials which, for example, are not easily removed from the article by ordinary mechanical means. Thus, the term "contaminant" encompasses inorganic and organic materials such as greases, waxes, oils, adhesives, and rosin fluxes.

The present methods preferably include the step of contacting the article to be cleaned with a liquid or vapor solvating agent of the present invention. In this context, the term "solvating agent" refers to a combination of solvents which together have a tendency to solvate the contaminant(s). The term "solvent" as used herein refers to a compound, or an azeotrope-like combination of two or more compounds, which is capable of dissolving another substance (solute). Here, by solution it is meant a heterogeneous mixture of substances that includes mechanical suspensions, colloidal solutions, true solutions, and the like. Types of solvents include polar solvents, such as water, and non-polar solvents, such as hydrocarbons. Other solvents groups include, but are not limited to, alcohols, esters, ethers, ketones, amines, and nitrated and chlorinated hydrocarbons.

Generally, the terms "flammable solvent" and "flammable solvent mixtures" as used herein refer to solvents or mixtures of solvents that ignite easily and burn rapidly. Nonflammable solvents and solvent mixtures are, by corollary, those solvents and solvent mixtures that are difficult to ignite and burn slowly.

In certain preferred embodiments, for example those in which the flammable solvent of the present invention has a normal boiling point greater than about 20° C., the flammable solvent is a material having a flash point below its normal boiling point (wherein the flash point is measured by the standard Tag Open Cup (ASTM D-1310) or Tag Closed Cup (ASTM D-56), each of which is incorporated herein by reference), with the nonflammable solvents each having a flash point below their normal boiling points, respectively (wherein the flash point is measured by the standard Tag Open Cup (ASTM D-1310) or Tag Closed Cup (ASTM D-56)). In certain other preferred embodiments, for example those in which the flammable solvent of the present invention has a normal boiling point below about 20° C., the flammable solvent has a vapor flame limit as measured by the ASTM E-685 (which is incorporated herein by reference), with the nonflammable solvents having no vapor flame limit.

Any of a wide range of flammable and nonflammable solvents are suitable for use in the present invention. Suitable flammable solvents include, for example, hydrofluorocarbons ("HFCs"), such as isomers of pentafluorobutane (HFC-365), and the like, as well as, methylal, ethylal, isomers of cis and trans dichloroethylene, especially cis and trans 1,2-dichloroethylene, isopropyl chloride, pentane and other hydrocarbons, alcohols, and ketones, and the like. Certain preferred flammable solvents include cis and trans dichloroethylene. Suitable nonflammable solvents include, for example, HFCs such as, 1,1,1,3,3-pentafluoropropane (HFC-245fa) and other isomers of pentafluoropropane (HFC-245), isomers of hexafluoropropane (HFC-236), isomers of hexafluorobutane (HFC-356), decafluoropentane (HFC-4310), hydrochlorofluorocarbons (HCFCs), such as 1,1-dichloro-1-fluoroethane (HCFC-141b), isomers of dichloropentafluoroethane (HCFC-225), isomers of difluorotrichloroethane (HCFC-123), isomers of chlorotetrafluoroethane (HCFC-124), and the like, nonflammable hydrofluoroethers, such as methyl perfluorobutyl ether (HFE-7100), ethyl perfluorobutyl ether (HFE-7200), and the like, other chlorinated solvents, such as trichloroethylene, perchloroethylene, and the like, n-propyl bromide, nonflammable fluoroiodocarbons, and the like. Certain preferred nonflammable solvents include hydrocarbons, such as HFC-245fa, and hydrofluoroethers, such as HFE-7100 and HFE-7200.

For the proposes of this invention, an azeotropic system or composition is defined as a combination of two or more compounds that behave substantially like a single compound in so far as the vapor in substantial equilibrium with the liquid has substantially the same concentration of components as is present in the liquid. The term "azeotrope-like" is intended to refer to azeotropic compositions and to compositions which are not strictly azeotropic but in which the concentration of components in the vapor phase of the composition are so close to the concentration of components in the equilibrium liquid phase of the composition so as to make separation of the components by ordinary distillation not practically possible. In essence, the admixture distills without substantially changing its composition. Classifications of azeotropes include absolute azeotropes (compositions in which azeotropic conditions are satisfied over all values of temperature (up to the critical stage)) or limited azeotropes (compositions in which azeotropic conditions are satisfied only in a certain temperature range). Azeotropes can further be classified as homoazeotropes, wherein the composition exists in a single liquid phase, or heteroazeotropes, wherein the composition exists as two or more liquid phases. (Note that for heteroazeotropic compositions, it is the overall liquid composition of the multiple liquid phases that is identical to the vapor composition.) Also, azeotropic compositions can be described as binary, ternary, quaternary, or quinary azeotropes depending on whether the composition is composed of 2, 3, 4, or 5 compounds, respectively.

The phenomena of azeotropes can be demonstrated mathematically. At low to moderate pressure, with the assumption of ideal-gas model for the vapor phase, the vapor-liquid phase equilibrium (VLE) of any composition can be adequately describe by the following Modified Raoult's Law (Equation 1):

$$y_i P = x_i \gamma_i P_i^{sat} \quad \text{(Equation 1)}$$

Where: i=1, 2, . . . , c
$y_i$=mole fraction of component i in vapor phase
$x_i$=mole fraction of component i in liquid phase
P=system pressure
$P^{sat}$=vapor pressure of component i
$\gamma_i$=liquid phase activity coefficient of component i When $\gamma_i$=1, the composition is said to be ideal and Equation 1 simplifies to Raoult's Law. Nonideal compositions ($\gamma_i \neq 1$) can exhibit either positive ($\gamma_i > 1$) or negative deviations ($\gamma_i < 1$) from Raoult's Law. In many highly nonideal compositions these deviations become so large that the pressure-composition (P-x, y) and temperature-composition (T-x, y) phase diagrams exhibit a minimum or maximum azeotrope point. In the context of the T-x, y phase diagram, these points are called the minimum boiling azeotrope (where the boiling temperature of the azeotrope is less than that of the pure component) or maximum boiling azeotrope (the boiling temperature of the azeotrope is higher than that of the pure components). About 90% of the known azeotropes are of the minimum variety. At these minimum and maximum boiling azeotrope, the liquid phase and its equilibrium vapor phase have the same composition, i.e., $x_i = y_i$ for i=1, . . . , c. As is apparent from the equation $x_i = y_i$, azeotropes are formed only at specific mole ratios. Thus, a composition of 50 mol % water and 50 mole % ethanol does not form an azeotrope, but a composition of 10.57 mol % water and 89.43 mol % ethanol at 78.15° C. does.

In contrast to azeotropic compositions, non-azeotropic compositions (also known as "zeotropic compositions") used in the present invention are compositions in which the flammable solvent and the nonflammable solvents of the present invention are not in an azeotropic relationship with one another. Thus, the solvating agents and solvent compositions of the present invention have distinctly different characteristics than pure fluids. For example, the phase change of a non-azeotrope under constant pressure does not proceed at a constant temperature but rather over a range of temperature. In addition, the momentum, energy transfer, and mass transfer processes are closely linked. The vapor-liquid interfacial mass transfer rate limits the evaporation or condensation rate, and in turns limits the energy transfer rate. Examples of binary non-azeotropic compositions include, but are not limited to, mixtures of methylcyclohexane and toluene; tetrachloroethylene and acetone; tricholorethylene and benzene; and ethyl alcohol and ethylbenzene. Examples of ternary non-azeotropic compositions include, but are not limited to, mixtures of carbon tetrachloride, methyl alcohol, and benzene; chloroform, formic acid, and acetic acid; and HFC-245FA, trans-1,2-DCE, and HFE-7100.

Those skilled in the art will appreciate, however, that the present solvent compositions may include one or more azeotropic combinations within the composition, provided that the composition of the present invention is itself not azeotropic. For example, the flammable solvent of the present invention may comprise an azeotropic combination of two or more compounds, which, because they form an azeotrope, boil at a substantially constant temperature under the conditions of intended use. The present solvent composition is still considered to be a non-azeotropic composition provided that the flammable and nonflammable solvents do not form an azeotrope with one another. In fact, it is contemplated, although not necessarily preferred, that the present non-azeotropic solvent compositions may comprise an azeotropic flammable solvent and at least two azeotropic nonflammable solvents.

According to one aspect of the present invention, a method is provided for cleaning a contaminated article wherein the contaminated article is contacted with a non-azeotropic solvent composition which reduces the level of contaminates on the article. The present non-azeotropic solvent compositions of the present invention preferably include at least one flammable solvent, at least one non-flammable solvent having a boiling point higher than the boiling point of the flammable solvent, and at least one nonflammable solvent having a boiling point lower than the boiling point of the flammable solvent. Any suitable non-azeotropic composition of at least one flammable and two or more nonflammable solvents can be used according to the methods of the present invention, provided that the resulting non-azeotropic composition is nonflammable. In certain preferred embodiments, the non-azeotropic compositions, systems and solvating agents of the present invention comprise one flammable solvent and two nonflammable solvents. For example, one non-azeotropic solvent composition of the present invention includes trans-1,2-DCE as the flammable solvent (normal boiling point ("n.b.p")=47° C.), HFC-245fa as the nonflammable solvent having a boiling point lower than the flammable solvent (n.b.p.=15.3° C.), and HFE-7100 as the nonflammable solvent having a boiling point higher than the flammable solvent (n.b.p.=61° C.). In certain preferred embodiments the compositions, agents and systems of the present invention comprise two or more flammable solvents and three or more nonflammable solvents. In embodiments comprising two or more flammable solvents, it is preferred that each flammable solvent in the composition has a boiling point that falls between the boiling points of two nonflammable solvents in the system or composition.

A wide variety of method steps are available for removing a contaminant from an article using a solvent system, composition or agent of the present invention. For example, a liquid or vapor stream comprising a solvent composition of the present invention is brought into contact with the article, such as by passing the composition across the article. In alternative embodiments, the article is immersed in a liquid or vapor comprising the present solvent composition or the article may be sprayed with the present solvent mixture. In certain highly preferred embodiments, the present solvent composition is provided in the form of a vapor, and the present vapor composition is brought into contact with the article, such as in a vapor degreasing process.

In such embodiments, the solvent mixture is preferably in the vapor phase for at least a portion of the contacting step, and in certain embodiments for substantially the entire contacting step. As used herein, the term "substantially the entire contacting step" refers generally to an amount of time equal to at least about 70% of the time during which an article to be cleaned is in contact with a solvent mixture according to the present invention. Preferably, "substantially the entire contacting step" comprises at least about 80%, and even more preferably, at least about 90% of the time during which an article to be cleaned is in contact with a solvent mixture according to the present invention.

The contacting step of the present invention may be conducted in any suitable apparatus including, for example, in a reaction vessel, autoclave, vapor degreaser, or the like, and may be conducted while open or closed to the atmosphere. In certain preferred embodiments, the contacting step is conducted in a vapor degreaser.

In certain other preferred embodiments, the present contacting step need not be conducted in vessel. For example, aerosol spraying in which an aerosol comprising the present solvent composition is provided and then sprayed or otherwise contacted with the contaminated article. In general, sprayable-type compositions comprise a material to be sprayed and a propellant/solvent or mixture of propellant solvents. The sprayable compositions of the present invention may further comprise any of a wide range of inert ingredients, additional solvents, and other materials used conventionally in sprayable compositions.

The vapor degreasing aspects of the present invention are beneficially used in certain embodiments to contact the surface of an article, as well as, penetrate the holes, cracks, crevices, etc., of the article, so as to remove contaminants therefrom.

One embodiment of the present invention comprises a vapor phase degreasing method in which substantially only a vapor phase solvent composition or agent of the present invention is used for cleaning. In such embodiments, it is generally preferred that the contaminated article is contacted by a vapor composition of the present invention, which is preferably maintained at a relatively elevated temperature, and the relatively hot vapor condenses on the relatively cold article. This condensation step preferably comprises the step of dissolving at least a portion of the contaminants located on or in the article. In preferred embodiments, the vapor composition is located adjacent to, and preferably above, a mass of a liquid solvent composition of the present invention. For example, in certain preferred embodiments the vapor of the present invention is maintained in the vapor space above a reservoir of liquid solvent, and preferably the condensate containing the contaminates is introduced into the liquid solvent, preferably by falling under the influence of gravity from the article into the reservoir of solvent liquid. In preferred embodiments, the liquid solvent is evaporated continuously to form a vapor blanket comprising a composition of the present invention. Since the contaminants are not vaporized, they remain in the bottom of the tank in the form of a sludge. Preferably, the contact of the vapor with the article in such embodiments creates a scrubbing action as vapor condenses on the article, and preferably, the article is maintained in contact with the present vapor composition for a period of time to raise the temperature of the article to about the temperature of the vapor, whereupon condensation substantially ceases and thereafter the article is then removed from the degreaser. Those skilled in the art will appreciate that the time required to cause cessation of the condensation process depends upon numerous factors, including the particular solvent employed, the temperature of the vapor, the weight of the article, its specific heat, and the type of contamination material to be removed. In as least one embodiment, the cleaning steps are utilized after one or more aqueous cleaning steps.

Another vapor phase degreasing embodiment of the present invention comprises vapor-spray cycle degreasing. Such degreasing methods preferably comprise placing the article to be cleaned in a vapor comprising the present composition. The present vapor composition is preferably located adjacent to a liquid solvent reservoir, and the liquid in the liquid solvent reservoir also preferably comprises a solvent of the present invention. Such methods also preferably comprise providing means, such as a cooling coil or other relatively cold article or fluid, for condensing at least a portion of the vapor. The condensed vapor of the present invention is preferably collected and used to form a liquid spray directed at the article, preferably a warm liquid spray comprising a composition of the of the present invention. The step of forming the spray may comprise introducing the condensed liquid to a solvent reservoir and then pumping liquid solvent from the reservoir to a spray nozzle directed at the article. The spray preferably directly contacts the part, washing off contaminants and cooling the part, thereby cleaning by vapor condensation.

A third embodiment of vapor phase degreasing in accordance with the present invention comprises a liquid-vapor cycle degreaser which typically uses a tank or reservoir having at least a first and second sections. The first section of the tank preferably contains a boiling solvent composition of the present invention and the second section of the tank contains relatively cool, non-boiling solvent. Refrigerated coils located in the vapor space above the boiling solvent condense the solvent vapor. The condensate is transferred into the second section of the tank. A certain portion of the cold liquid solvent is returned to the first section of the tank to maintain a sufficient quantity of boiling liquid solvent. The cleaning process preferably proceeds by first introducing a relatively cold, contaminated article into the vapor space above the boiling solvent. The temperature difference between the contaminated article and the solvent vapor causes the solvent to condense on the contaminated article thereby achieving a solvating action on the contaminants. The condensed vapors and the contaminants solvated thereby are allowed to return to the first section of the tank, preferably by gravity feed. After the desired amount of cleaning action has occurred, the article is moved to the second section of the tank and immersed in the cold solvent, which is also preferably a composition of the present invention. The relatively cool article is then introduced once again into the relatively hot vapor space, where condensing vapors perform a final rinse of the article. This degreaser is particularly useful for heavily soiled articles or for cleaning a basket of small parts that nest together.

Since vapor degreasing operations generally involve the use of a heat source in relatively close proximity to the degreasing solvents in both liquid and vapor states, it is highly beneficial to use a solvent composition of the present invention which remains nonflammable in all parts of the degreasing process/apparatus in order to minimize or reduce the danger of fire or explosion in the degreasing process. The nonflammable solvent composition of the present inventions thus preferably has a flash point of above about 100° F., and even more preferably above about 141° F. (as measured by the standard Tag Open Cup (ASTM D-1310) or Tag Closed Cup (ASTM D-56)). In certain other preferred embodiments in which the initial boiling point under standard conditions of the solvent composition is below about 20° C., the flammable solvent has a vapor flame limit as measured by the ASTM E-685.

FIG. 1 shows a side view of an exemplary two-sump vapor degreaser suitable for use with the present methods. In the illustrated two-sump vapor degreaser, a non-azeotropic solvent composition of the present invention is initially charged into the boiling sump where it is brought to a boil (1). The evaporated solvent (3) rises above the boiling sump to form in a vapor zone a vapor phase, which in many embodiments is also a composition of the present invention, although because the composition is non-azeotropic systems, the solvent composition in the vapor zone is different than the solvent composition in the boiling sump. The solvent vapor is contacted with condensing coils (4) and is condensed into a liquid condensate. This condensate is channeled into the condensate sump where it is held as warm solvent (2). The solvent condensate continues to enter into the condensate sump until the condensate sump is full at which point it cascades over a weir and into the boiling sump where it mixes with the boiling solvent. This type of vapor degreasing apparatus is available commercially from a number of sources, for example, the Baron Blakeslee model MSR-120LE, available from LR Environmental Equipment Co. Inc.

EXAMPLES

The following examples further illustrate the present invention. The first two examples demonstrate that a non-azeotropic solvent composition according to the present invention can be maintained in a degreasing unit. The third example demonstrates the cleaning efficacy of this solvent composition on various types of contaminants. In each of these examples, the solvent composition was comprised of nonflammable HFC-245fa, flammable trans-1,2-DCE, and nonflammable HFE-7100.

Example 1

This example illustrates how the ratio of solvents in a ternary composition varies during a 24-hour degreasing process in which the degreasing unit is closed to the surrounding atmosphere. The ratio of solvents in the vapor and liquid phases is monitored at multiple time points. Different ratios of solvents in the boiling liquid phase vs. the vapor phase indicate a non-azeotropic composition.

For this test, a Baron Blakeslee model MSR-120LE degreaser was used. This degreaser has two sumps: a condensate sump measuring 10-inches wide by 12-inches long by 10-inches deep; and a boil sump measuring 10-inches wide by 12-inches long by 12.5-inches deep. The top opening of the degreaser measures 12.5-inches wide by 21-inches long. The freeboard for this degreaser is 12 inches, which constitutes about 100% freeboard ratio. (Note: the freeboard ratio is the ratio of the freeboard height—distance from top of liquid to degreaser rim—to the width of the degreaser.) This degreaser is equipped with cooling coils and an internal refrigeration unit which is set to maintain a temperature of −2° C.

The ternary solvent composition at the start of the degreasing operation consists of 31.04% by weight of HFC-245fa, 34.03% by weight of trans-1,2-DCE, and 34.93% by weight of HFE-7100. This solvent composition is charged into the boil sump where it is heated to a boil. As the solvent composition evaporates, the vapors come into contact with the cooling coils. The cooling coils absorb heat from the vapors causing them to condense back into a liquid. The liquid condensate is then channeled into the condensate sump where it accumulates. Once the condensate has overfilled the condensate sump, it cascades into the boil sump. This process is continued for 24 hours.

During the test, samples of the solvent mixture are extracted from the boil sump, the condensate sump, and the cooling trough (where the condensed vapors collect) and then analyzed by gas chromatography. This analysis indicates the relative amounts of each solvent in the samples. Samples are taken at 0:00 hours, 1:00 hour, 1:44 hours, 4:50 hours, 6:14 hours, 8:00 hours, and 24:00 hours from the start of degreasing process. The temperature of the mixture in the boil sump, the vapor, and the condensate is also monitored.

The test data are presented in Table 1. In summary, the data indicate that the nonflammable HFC-245fa (having the lowest boiling point of the three solvents) constituted a larger percentage of the vapor phase as compared to the amount of this solvent in the liquid phase of the boil sump. Likewise, the percentage of the nonflammable HFE-7100 (having the highest boiling points of the three solvents) was less in the vapor phase than in the liquid phase of the boil sump. The overall solvent composition in the degreaser system (i.e., the amount of the solvents in the boil sump, vapor zone, and condensate sump) remained essentially constant because the degreaser was closed to the atmosphere. The data demonstrate that an azeotrope was not formed by the combination of these three solvents.

TABLE 1

| Exposure | | Concentration (weight %) | | | Temperature (° C.) | | |
|---|---|---|---|---|---|---|---|
| Time (hours) | Solvent | Condensate Sump | Boil Sump | Trough | Boil Sump | Vapor Zone | Condensate |
| 0:00 | HFC-245fa | 0.00 | 31.04 | 0.00 | — | — | — |
|  | trans-1,2-DCE | 0.00 | 34.03 | 0.00 |  |  |  |
|  | HFE-7100 | 0.00 | 34.93 | 0.00 |  |  |  |
| 1:00 | HFC-245fa | 30.97 | 17.42 | 57.73 | 25.5 | 24.8 | 20.7 |
|  | trans-1,2-DCE | 34.05 | 37.46 | 24.94 |  |  |  |
|  | HFE-7100 | 34.98 | 45.12 | 17.32 |  |  |  |
| 1:44 | HFC-245fa | 31.57 | 13.95 | 54.46 | 26.8 | 26.1 | 21.6 |
|  | trans-1,2-DCE | 33.24 | 37.65 | 26.30 |  |  |  |
|  | HFE-7100 | 35.19 | 48.40 | 19.24 |  |  |  |
| 4:50 | HFC-245fa | 32.00 | 9.83 | 51.71 | 28.2 | 27.4 | 21.6 |
|  | trans-1,2-DCE | 33.26 | 38.02 | 26.33 |  |  |  |
|  | HFE-7100 | 34.74 | 52.15 | 21.96 |  |  |  |
| 6:14 | HFC-245fa | 32.35 | 9.60 | 46.33 | 28.4 | 27.6 | 21.4 |
|  | trans-1,2-DCE | 33.79 | 37.16 | 27.56 |  |  |  |
|  | HFE-7100 | 33.86 | 53.24 | 26.11 |  |  |  |

TABLE 1-continued

| Exposure | | Concentration (weight %) | | | Temperature (° C.) | | |
|---|---|---|---|---|---|---|---|
| Time (hours) | Solvent | Condensate Sump | Boil Sump | Trough | Boil Sump | Vapor Zone | Condensate |
| 8:00 | HFC-245fa | 32.09 | 9.32 | 48.60 | 28.4 | 27.6 | 21.4 |
|  | trans-1,2-DCE | 34.58 | 38.49 | 28.91 |  |  |  |
|  | HFE-7100 | 33.33 | 52.19 | 22.49 |  |  |  |
| 24:00 | HFC-245fa | 30.64 | 8.93 | 48.34 | 28.4 | 27.6 | 21.4 |
|  | trans-1,2-DCE | 35.23 | 38.33 | 29.12 |  |  |  |
|  | HFE-7100 | 34.13 | 52.74 | 22.64 |  |  |  |

Example 2

This example illustrates how the ratio of solvents in a ternary composition varies during a 3.5-hour degreasing process in which the degreasing unit is open to the surrounding atmosphere. The ratio of solvents in the vapor and liquid phases are monitored at multiple time points. Different ratios of solvents in the boiling liquid phase vs. the vapor phase indicates a non-azeotropic composition.

For this test, a mini-degreaser is utilized. This degreaser has three sumps: a condensate sump measuring 4-inches wide by 4-inches long; a middle sump measuring 4-inches wide by 4-inches long; and a boil sump measuring 4-inches wide by 4-inches long. The top opening of the degreaser measures 4-inches wide by 13-inches long. The freeboard for this degreaser is 3.25 inches, which constitutes less than a 100% freeboard ratio. (Note: the freeboard ratio is the ratio of the freeboard height—distance from top of liquid to degreaser rim—to the width of the degreaser.) This degreaser is equipped with cooling coils and an internal refrigeration unit which was set to maintain a temperature of 5° C. The degreaser also has a lip exhaust.

The ternary solvent composition at the start of the degreasing operation consists of 31.04% by weight of HFC-245fa, 34.03% by weight of trans-1,2-DCE, and 34.93% by weight of HFE-7100. This solvent composition is charged into the boil sump where it is heated to a boil. As the solvent composition evaporates, the vapors come into contact with the cooling coils. The cooling coils absorb heat from the vapors causing them to condense back into a liquid. The liquid condensate is then channeled into the condensate sump where it accumulates. This process continues for 3.5 hours.

During the process, samples are extracted from the boil sump, the middle sump, the condensate sump, and the cooling trough (where the condensed vapors collect) and then analyzed by gas chromatography to determine the relative amounts of each solvent in the sample. Samples are taken at 0:00 hours, 1:00 hour, 2:00 hours, and 3:50 hours from the start of degreasing process. The temperature of the mixture in the boil sump and in the vapor zone is also monitored.

The test data are presented in Table 2. In summary, the data indicate that the nonflammable HFC-245fa (having the lowest boiling point of the three solvents) constituted a larger percentage of the vapor phase as compared to the amount of this solvent in the liquid phase of the boil sump. Likewise, the percentage of the nonflammable HFE-7100 (having the highest boiling points of the three solvents) was less in the vapor phase than in the liquid phase of the boil sump. However, because the system is open to the atmosphere, the more volatile solvents are evaporated off which leads to a change in the overall solvent composition. The data demonstrate that an azeotrope was not formed by the combination of these three solvents.

TABLE 2

| Exposure | | Concentration (weight %) | | | | Temperature (° C.) | |
|---|---|---|---|---|---|---|---|
| Time (hours) | Solvent | Condensate Sump | Middle Sump | Boil Sump | Trough | Boil Sump | Vapor Zone |
| 0:00 | HFC-245fa | 0.00 | 0.00 | 31.04 | 0.00 | 24.3 | 23.4 |
|  | trans-1,2-DCE | 0.00 | 0.00 | 34.03 | 0.00 |  |  |
|  | HFE-7100 | 0.00 | 0.00 | 34.93 | 0.00 |  |  |
| 1:00 | HFC-245fa | 34.39 | 30.88 | 17.80 | 60.15 | 26.9 | 23.4 |
|  | trans-1,2-DCE | 33.63 | 34.68 | 38.60 | 24.69 |  |  |
|  | HFE-7100 | 31.98 | 34.44 | 43.60 | 15.41 |  |  |
| 2:00 | HFC-245fa | 35.95 | 28.21 | 11.01 | 56.97 | 30.0 | 23.3 |
|  | trans-1,2-DCE | 32.98 | 35.67 | 40.18 | 26.69 |  |  |
|  | HFE-7100 | 31.07 | 36.12 | 48.81 | 16.34 |  |  |
| 3:50 | HFC-245fa | 36.87 | 23.30 | 7.62 | 53.62 | 32.4 | 25.5 |
|  | trans-1,2-DCE | 32.99 | 37.47 | 40.74 | 27.86 |  |  |
|  | HFE-7100 | 31.04 | 39.23 | 51.64 | 18.52 |  |  |

Example 3

This example illustrates the cleaning efficacy of a non-azeotropic ternary solvent composition according to this invention.

In this cleaning study, twelve 304-grade stainless steel coupons measuring 3-inches in length by 0.75-inches in width were coated with various materials, namely light mineral oil, Kester 1585 (a flux designed for high speed, automated soldering techniques for printed circuit board assemblies), and Fomblin AM 3001 (a fluorolubricant). These materials represent contaminants typically encountered in a degreasing process. The coupons are soiled by dipping them into the simulated contaminant so that approximately two-thirds of the coupon's surface area is covered. The coupons containing the mineral oil and Fomblin are drained vertically for approximately one hour. The coupons containing the Kester flux are dried under a 400° F. air knife for 30-60 seconds. The weight of the coupon is taken before and after the coupon is contaminated with the difference in weight indicative of the amount of contaminant on the coupon.

After the coupons are prepared, the cleaning efficacy of two solvent compositions are tested. The first composition, which contained 32.03% by weight of HFC-245fa, 33.98% by weight of trans-1,2-DCE, and 33.99% by weight of HFE-7100, represents a non-azeotropic solvent composition according to this invention at the beginning of a vapor degreasing cycle. (For comparison, see Table 1-"Boil Sump Concentration" at 0:00 hours.) The second solvent composition, which contains 8.98% by weight of HFC-245fa, 38.36% by weight of trans-1,2-DCE, and 52.66% by weight of HFE-7100, represents a non-azeotropic solvent composition according to this invention at the end of a 24-hour vapor degreasing cycle. (For comparison, see Table 1-"Boil Sump Concentration" at 24:00 hours.)

The cleaning process involves submerging the entire coupon in 120 cc of the solvent mixture for one minute. While the coupon is submerged, the solvent mixture is stirred. After one minute has elapsed, the coupon is removed, blown dry with nitrogen gas, and then weighed. The difference between the weight of the contaminated coupon and the weight of the clean, dry coupon reflects the amount of contaminant removed.

The cleaning test data are presented in Tables 3 and 4. In summary, the data indicate that this non-azeotropic solvent composition removes substantially all of the mineral oil and Fomblin contaminants and approximately 80-90% of the Kester contaminant.

TABLE 3

Solvent Composition: 32.03 wt. % HFC-245fa; 33.98 wt. % trans-1,2-DCE; 33.99 wt. % HFE-7100

| Coupon No. | Contaminant | Coupon Weight w/ Contaminant (g) | Weight of Contaminant (g) | Final Coupon Weight (g) | % Removal |
|---|---|---|---|---|---|
| 1 | light mineral oil | 16.9566 | 0.0460 | 16.9566 | 100.00 |
| 2 | light mineral oil | 17.0300 | 0.0354 | 17.0300 | 100.00 |
| 3 | Kester 1585 flux | 16.9665 | 0.0747 | 16.9753 | 88.22 |
| 4 | Kester 1585 flux | 16.7759 | 0.0720 | 16.7900 | 80.42 |
| 5 | Fomblin AM 3001 | 17.7016 | 0.0597 | 17.7017 | 99.84 |
| 6 | Fomblin AM 3001 | 17.0415 | 0.0624 | 17.0419 | 99.36 |

TABLE 4

Solvent Composition: 8.98 wt. % HFC-245fa; 38.36 wt. % trans-1,2-DCE; 52.66 wt. % HFE-7100

| Coupon No. | Contaminant | Coupon Weight w/ Contaminant (g) | Weight of Contaminant (g) | Final Coupon Weight (g) | % Removal |
|---|---|---|---|---|---|
| 7 | light mineral oil | 17.5358 | 0.0445 | 17.5357 | 100.00 |
| 8 | light mineral oil | 16.9183 | 0.0449 | 16.9179 | 100.00 |
| 9 | Kester 1585 flux | 16.6696 | 0.0563 | 16.6756 | 89.34 |
| 10 | Kester 1585 flux | 16.9682 | 0.0604 | 16.9746 | 89.40 |
| 11 | Fomblin AM 3001 | 16.9543 | 0.0533 | 16.9541 | 100.00 |
| 12 | Fomblin AM 3001 | 16.8964 | 0.0546 | 16.8964 | 100.00 |

It should be understood that the aforementioned examples constitute only some of the possible embodiments of this invention and that the invention is not limited to only those embodiments portrayed in these examples. This invention can also be applied to cleaning methods other than degreasing. Moreover, the solvent composition formulation can be tailored so as to optimize the removal of specific contaminants.

What is claimed is:

1. A method for cleaning an article containing contaminants comprising:
   (a) providing a zeotropic solvent composition comprising at least one flammable solvent having a boiling point at a first pressure, at least one first nonflammable solvent having a boiling point lower than said flammable solvent boiling point at said first pressure, and at least one second nonflammable hydrofluorocarbon or hydrofluoroether solvent having a boiling point higher than said flammable solvent boiling point at said first pressure; and
   (b) contacting the article with said zeotropic solvent composition to remove at least a portion of the contaminants from said article.

2. The method of claim 1 wherein said contacting comprises contacting the article with a stream comprising said zeotropic composition.

3. The method of claim 1 wherein said contacting comprises immersing the article in said zeotropic solvent composition.

4. The method of claim 1 wherein said providing comprises providing a liquid phase comprising said zeotropic solvent composition and providing a vapor phase comprising said zeotropic solvent composition, and said contacting comprises immersing the article in said liquid phase and in said vapor phase.

5. The method of claim 1 wherein said contacting comprises spraying the article with said zeotropic solvent composition.

6. The method of claim 1 wherein at least a portion of the contacting is conducted in a vapor degreaser.

7. The method of claim 1 wherein said flammable solvent is selected from the group consisting of isomers of HFC-365, methylal, ethylal, cis and trans dichloroethylene, isopropyl chloride, pentane and other $C_1$-$C_{20}$ hydrocarbons, $C_1$-$C_{20}$ hydrocarbon alcohols, and $C_1$-$C_{20}$ hydrocarbon ketones.

8. The method of claim 1 wherein said flammable solvent comprises trans-1,2-dichloroethylene.

9. The method of claim 1 wherein said at least one second nonflammable solvent is selected from the group consisting of HFC-4310, HFE-7100, and HFE-7200 and said at least one first nonflammable solvent is selected from the group consisting of HFC-245fa and other isomers of HFC-245, isomers of HFC-236, isomers of HFC-356, HCFC-141b, isomers of HCFC-225, isomers of HCFC-123, and isomers of HCFC-124.

10. The method of claim 2 wherein said contacting comprises passing said stream across the article.

11. The method of claim 2 wherein said zeotropic solvent composition is in vapor phase for at least a portion of the contacting.

12. The method of claim 8 wherein said at least one first nonflammable solvent comprises HFC-245fa.

13. The method of claim 8 wherein said at least one second nonflammable solvent comprises HFE-7100.

14. The method of claim 12 wherein said at least one second nonflammable solvent comprises HFE-7100.

15. A zeotropic solvent composition comprising in a zeotropic relationship:
 (a) at least one flammable solvent having a boiling point at a first pressure;
 (b) at least one first nonflammable solvent having a boiling point that is lower than said flammable solvent boiling point at said first pressure; and
 (c) at least one second nonflammable hydrofluorocarbon or hydrofluoroether solvent having a boiling point that is higher than said flammable solvent boiling point at said first pressure.

16. The composition of claim 15 wherein said flammable solvent is an azeotropic combination of at least two compounds.

17. The composition of claim 15 wherein at least one of said nonflammable solvents is an azeotropic combination of at least two compounds.

18. The composition of claim 15 wherein said flammable solvent is selected from the group consisting of isomers of HFC-365, methylal, ethylal, cis and trans dichloroethylene, isopropyl chloride, $C_1$-$C_{20}$ hydrocarbons, $C_1$-$C_{20}$ hydrocarbon alcohols, and $C_1$-$C_{20}$ hydrocarbon ketones.

19. The composition of claim 15 wherein said flammable solvent comprises trans-1,2-dichloroethylene.

20. The composition of claim 15 wherein said at least one second nonflammable solvent is selected from the group consisting of HFC-4310, HFE-7100, and HFE-7200 and said at least one first nonflammable solvent is selected from the group consisting of HFC-245fa and other isomers of HFC-245, isomers of HFC-236, isomers of HFC-356, HCFC-141b, isomers of HCFC-225, isomers of HCFC-123, and isomers of HCFC-124.

21. The composition of claim 15 wherein said at least one first nonflammable solvent comprises HFC-245fa.

22. The composition of claim 15 wherein said at least one second nonflammable solvent comprises HFE-7100.

23. The composition of claim 21 wherein said at least one second nonflammable solvent comprises HFE-7100.

24. The composition of claim 15 wherein said first pressure is about one atmosphere.

25. A sprayable composition comprising a composition according to claim 15.

26. A method for cleaning an article containing contaminants comprising vapor degreasing said article in the absence of any flammable vapor or liquid phase, the method comprising:
 (a) providing a zeotropic solvent composition comprising at least one flammable solvent having a boiling point at a first pressure, at least one first nonflammable solvent having a boiling point lower than said flammable solvent boiling point at said first pressure, and at least one second nonflammable hydrofluorocarbon or hydrofluoroether solvent having a boiling point higher than said flammable solvent boiling point at said first pressure; and
 (b) contacting the article with said zeotropic solvent composition to remove at least a portion of the contaminants from said article.

27. The method of claim 26 wherein said first pressure is about one atmosphere.

28. The method of claim 26 wherein said contacting comprises immersing the article in a said zeotropic solvent composition.

29. The method of claim 26 wherein said providing comprises providing a liquid phase comprising said zeotropic solvent composition and providing a vapor phase comprising said zeotropic solvent composition, and said contacting comprises immersing the article in said liquid phase and in said vapor phase.

30. The method of claim 26 wherein said contacting comprises spraying the article with said zeotropic solvent composition.

31. The method of claim 26 wherein said flammable solvent is selected from the group consisting of isomers of HFC-365, methylal, ethylal, cis and trans dichloroethylene, isopropyl chloride, $C_1$-$C_{20}$ hydrocarbons, $C_1$-$C_{20}$ hydrocarbon alcohols, and $C_1$-$C_{20}$ hydrocarbon ketones.

32. The method of claim 26 wherein said flammable solvent comprises trans-1,2-dichloroethylene.

33. The method of claim 26 wherein said at least one second nonflammable solvent is selected from the group consisting of HFC-4310, HFE-7100, and HFE-7200 and said at least one first nonflammable solvent is selected from the group consisting of HFC-245fa and other isomers of HFC-245, isomers of HFC-236, isomers of HFC-356, HFC-141b, isomers of HCFC-225, isomers of HCFC-123, and isomers of HCFC-124.

34. The method of claim 26 wherein said at least one first nonflammable solvent comprises HFC-245fa.

35. The method of claim 26 wherein said at least one second nonflammable solvent comprises HFE-7100.

36. The method of claim 34 wherein said at least one second nonflammable solvent comprises HFE-7100.

* * * * *